(12) United States Patent
Roesner et al.

(10) Patent No.: US 8,982,552 B2
(45) Date of Patent: Mar. 17, 2015

(54) SYSTEM FOR PROVIDING PHYSICALLY SEPARATED COMPUTE AND I/O RESOURCES IN THE DATACENTER TO ENABLE SPACE AND POWER SAVINGS

(75) Inventors: Arlen L. Roesner, Fort Collins, CO (US); Brandon Rubenstein, Loveland, CO (US); John F. Hutton, Fort Collins, CO (US); Richard Stanton Self, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 203 days.

(21) Appl. No.: 13/387,085

(22) PCT Filed: Dec. 28, 2009

(86) PCT No.: PCT/US2009/069604
§ 371 (c)(1),
(2), (4) Date: Jan. 25, 2012

(87) PCT Pub. No.: WO2011/081620
PCT Pub. Date: Jul. 7, 2011

(65) Prior Publication Data
US 2012/0134678 A1    May 31, 2012

(51) Int. Cl.
| | |
|---|---|
| G06F 1/20 | (2006.01) |
| H05K 7/20 | (2006.01) |
| G06F 13/14 | (2006.01) |
| G06F 1/18 | (2006.01) |
| G06F 1/32 | (2006.01) |
| H05K 7/14 | (2006.01) |

(52) U.S. Cl.
CPC *G06F 1/20* (2013.01); *G06F 13/14* (2013.01); *G06F 1/18* (2013.01); *G06F 1/32* (2013.01); *H05K 7/14* (2013.01); *H05K 7/20* (2013.01); *Y02B 60/1228* (2013.01); *Y02B 60/1235* (2013.01); *Y02B 60/1275* (2013.01)
USPC ............ 361/679.47; 361/679.46; 361/679.53; 361/690; 361/694; 361/699; 361/701; 361/702; 361/716; 165/104.33

(58) Field of Classification Search
USPC .................. 361/679.47–679.48, 679.53, 690, 361/694–695, 699, 702; 165/104.33; 454/184
See application file for complete search history.

(56) References Cited

U.S. PATENT DOCUMENTS

| | | | | |
|---|---|---|---|---|
| 6,619,697 | B2 * | 9/2003 | Griffioen et al. ............ | 285/126.1 |
| 7,020,359 | B2 * | 3/2006 | Mayer ............................. | 385/24 |
| 7,139,452 | B2 * | 11/2006 | Mayer et al. .................... | 385/24 |
| 7,373,268 | B1 * | 5/2008 | Viredaz et al. ................. | 702/130 |
| 7,477,514 | B2 * | 1/2009 | Campbell et al. ............. | 361/699 |
| 7,564,685 | B2 * | 7/2009 | Clidaras et al. ............... | 361/699 |
| 7,596,476 | B2 | 9/2009 | Rasmussen et al. | |

(Continued)

*Primary Examiner* — Robert J Hoffberg
(74) *Attorney, Agent, or Firm* — Andrews Kurth LLP

(57) ABSTRACT

An embodiment of a system and method disaggregate I/O resources from a server's compute resources, such as CPU and memory, by moving the server's local I/O devices to a remote location apart from the server's compute resources. An embodiment uses optical technology to accomplish the fast communication speeds needed between the compute resources and the remotely located I/O resources. Specifically, an embodiment uses fiber-optic cables and electrical-to-optical conversion to facilitate communication between the compute resources and the I/O resources. The compute resources and the remotely located I/O resources can be designed differently to allow conductive liquid cooling for the compute resources and air cooling for the I/O resources.

15 Claims, 5 Drawing Sheets

(56) References Cited

U.S. PATENT DOCUMENTS

| | | | |
|---|---|---|---|
| 7,660,121 B2 * | 2/2010 | Campbell et al. | 361/698 |
| 7,903,925 B2 * | 3/2011 | Cooke et al. | 385/136 |
| 8,064,200 B1 * | 11/2011 | West et al. | 361/695 |
| 8,416,834 B2 * | 4/2013 | DeCusatis et al. | 375/130 |
| 2003/0200330 A1 * | 10/2003 | Oelke et al. | 709/238 |
| 2005/0235671 A1 | 10/2005 | Belady et al. | |
| 2006/0187639 A1 * | 8/2006 | Carswell | 361/699 |
| 2007/0297136 A1 | 12/2007 | Konshak | |
| 2008/0158818 A1 * | 7/2008 | Clidaras et al. | 361/699 |
| 2009/0086432 A1 * | 4/2009 | Campbell et al. | 361/696 |
| 2012/0215902 A1 * | 8/2012 | DeCusatis et al. | 709/223 |

* cited by examiner

SYSTEM FOR PROVIDING PHYSICALLY SEPARATED COMPUTE AND I/O RESOURCES IN THE DATACENTER TO ENABLE SPACE AND POWER SAVINGS

BACKGROUND

Conventional computer servers typically incorporate the compute resources, e.g., central processing unit (CPU) and memory, and input/output (I/O) adaptors within the same enclosure in a datacenter. The few systems that make use of disaggregated I/O typically contain some I/O functionality that still export specific I/O fabrics that are still locally tied to the server. As a result, these hardware types are physically close to each other, and must be powered and cooled in the datacenter assuming this close proximity.

Server enclosures containing CPUs & memory continue to demand air cooling because the enclosures incorporate specialized I/O devices and other components that cannot be cooled by alternate cooling methods other than air cooling, e.g., exclusive heat conduction to the rack.

Servers that do have disaggregated I/O typically remain located near I/O equipment because I/O link cabling between these resources tends to be local to the server and there is often no need to separate them further.

DESCRIPTION OF THE DRAWINGS

The detailed description will refer to the following drawings in which like numbers refer to like objects, and in which.

DETAILED DESCRIPTION

Traditional server computing systems incorporate input/output (I/O) resources, i.e., I/O hardware, along with the compute resources, i.e., compute hardware, typically because of the need to communicate between the compute and I/O resources at fast speeds. Examples of compute resources include central processing unit (CPU) and memory.

An embodiment of a system and method disaggregate I/O resources (i.e., hardware and devices) from a server's compute resources, such as CPU and memory, by moving the server's local I/O devices to a remote location apart from the server's compute resources. An embodiment uses optical technology to separate direct-attach I/O root ports from CPUs and memory in a server architecture and to accomplish the fast communication speeds needed between the compute resources and long distances associated with remotely located I/O resources. Specifically, an embodiment uses fiber-optic cables (i.e., optical cables) and electrical-to-optical conversion to facilitate communication between the compute resources and the I/O resources. The compute resources and the remotely located I/O resources can be designed differently to allow for liquid cooling exclusively for the compute resources and air cooling for the I/O resources.

Further, the datacenter may be segregated into equipment locales that differ in their cooling requirements. With the segregation of the compute and I/O resources, the floor-space rack density of the compute resources can be increased, thus increasing power and cooling efficiency, and providing a safe way to integrate liquid cooling at the rack-level. As a result, datacenter power and cooling can be performed more efficiently, thus saving cost at the datacenter level.

Further, the optical cables can connect many servers to many I/O devices and use fewer links than traditional I/O fabrics. The I/O devices may be housed in a separate I/O enclosure, which may use traditional air cooling in the datacenter. Without the overhead of having high-powered CPUs and memories present in the I/O enclosure, these I/O devices will consume less energy using the traditional air cooling infrastructure of the datacenter.

Figure 1A:
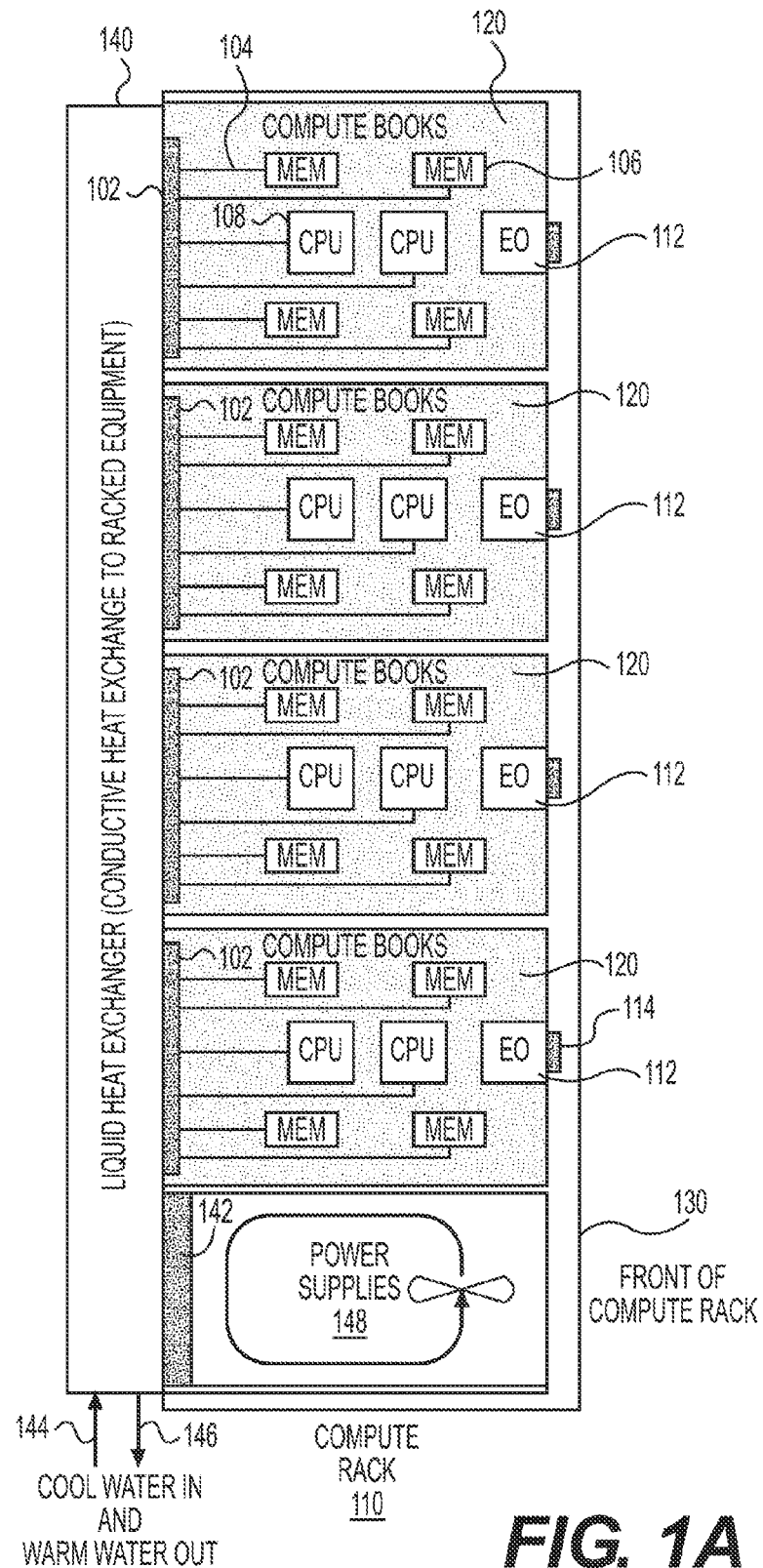
FIGS. 1A, 1B illustrate exemplary configured racks for providing physically separated compute and I/O resources in the datacenter to enable space and power savings.
Figure 1B:
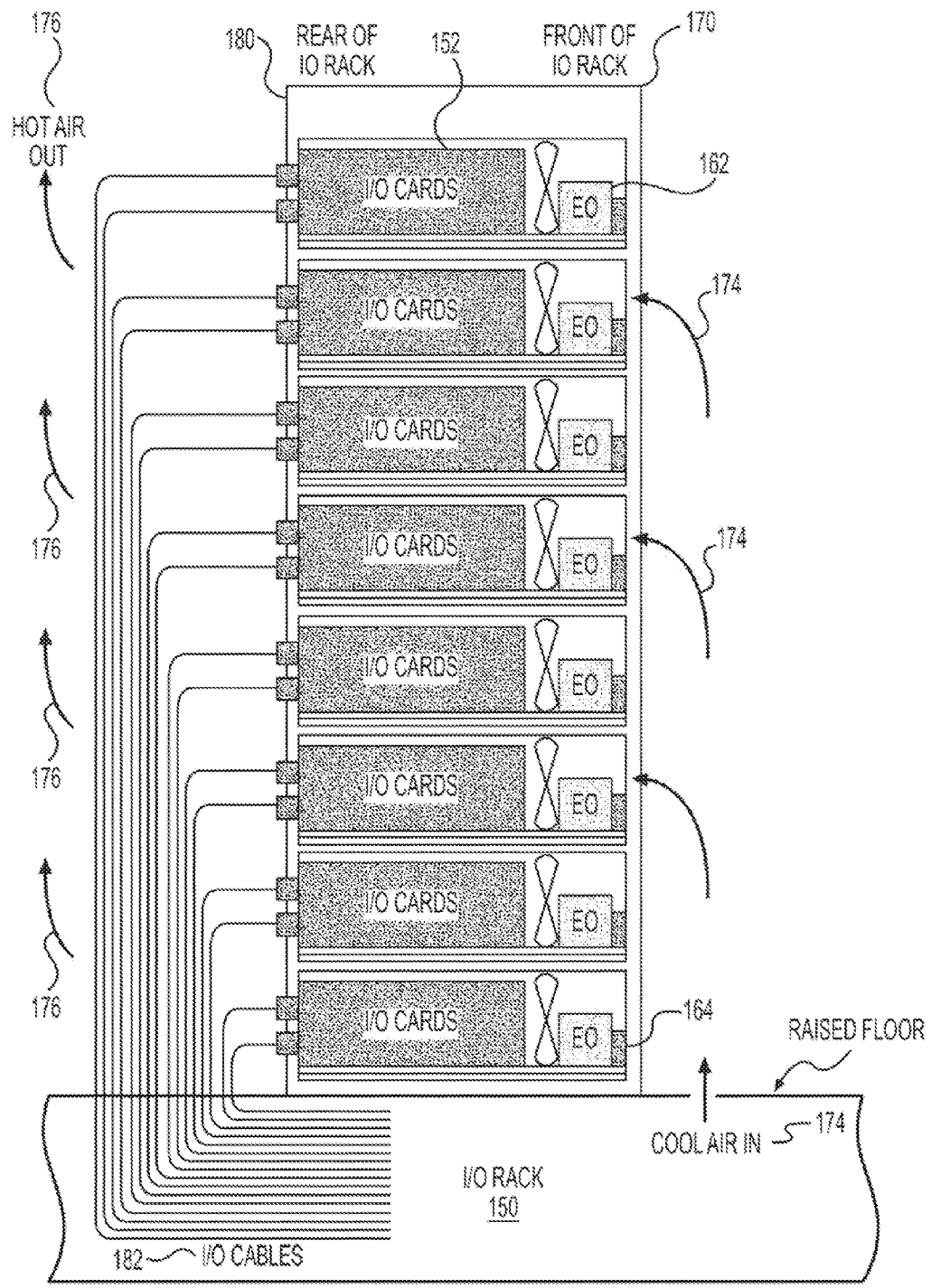
Figure 2:
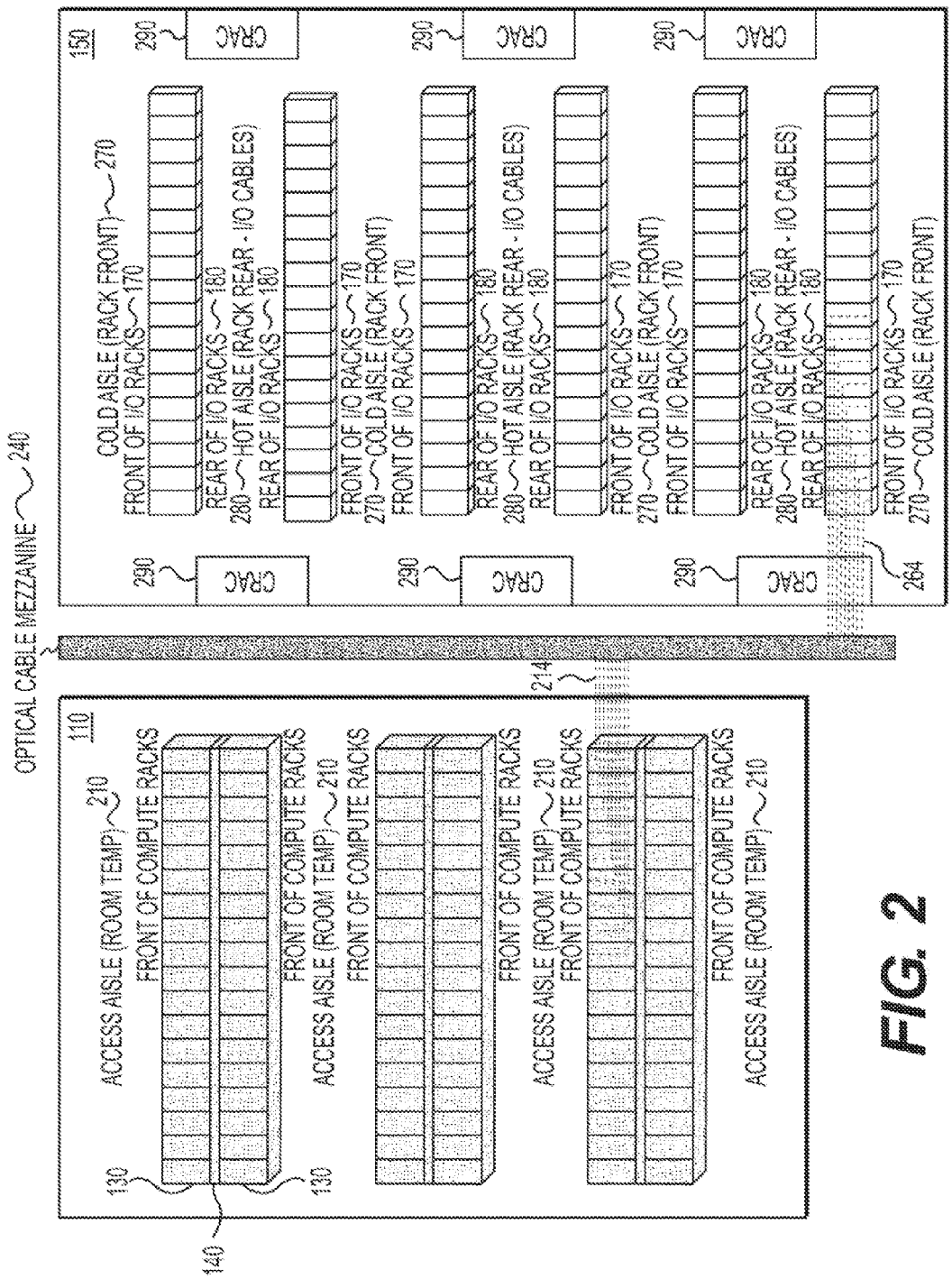
FIG. 2 is a top view of the exemplary data center floor plan for providing physically separated compute and I/O resources in the datacenter to enable space and power savings.

FIGS. 1A, 1B and 2 illustrate an exemplary conductively-cooled compute rack 110 (shown in FIGS. 1A and 2) that is physically separated from an exemplary air-cooled I/O rack 150 (shown in FIGS. 1B and 2). These figures show a conductively cooled compute-rack for illustration purposes only. One skilled in the art will appreciate that other types of liquid-cooling can equally be applied.

Referring to FIG. 1A, the exemplary compute rack 110 includes compute books 120, which houses compute hardware, such as memory 106 and CPU 108. The compute hardware typically uses more power than the I/O hardware, thus liquid cooling is preferred for the compute hardware. After the separation of the compute and I/O hardware, liquid cooling can be used to cool the compute hardware by providing a central cooling zone. Specifically, the compute rack 110 may include heat pipes 104 that transfer heat from major heat producers, such as the memory 106 and the CPU 108, to a central conductive liquid-to-liquid heat exchanger 140 permitting the attachment of rack-based cold plates 102 (i.e., heat flow plates) located in the rear of the compute rack. The central heat exchanger is supplied with cool water 144, and warm water 146 leaves it as heat is exchanged. The central heat exchanger 140, can also connect to other components cooled with conventional fans such as the power supplies 148. To cool these components, a sealed compartment in the product can be designed to provide a closed-loop path of air that is directly into a smaller air-to-liquid heat exchanger 142 that connects to the same central liquid-to-liquid heat exchanger at the rear of the compute rack. Another valid instance of an exclusively liquid-cooled rack, other than that detailed here, is the use of self-contained closed-loop air conditioning (AC) units that attach to a single rack and provide cool air to the front of the compute rack while collecting heated air at the back of the rack.

Referring to FIG. 1A, all compute hardware may be located at the compute rack front 130, with the cold plates 102 located at the rear of the compute rack 110. The only cables needed to connect to the remote I/O racks are located at the compute rack front 130, where optical communications to the externally located I/O resources are found. Specifically, with continued reference to FIG. 1A, compute rack electrical to optical (EO) conversion devices 112 are located at the compute rack front near compute rack optical ports 114. Compute rack optical cables 214 (shown in FIG. 2) connect the compute rack optical ports 114 to an optical cable mezzanine 240 (shown in FIG. 2), which is connected to the externally located I/O resources. As a result, the system and method provide liquid cooling at the server rack without bringing liquid into the server equipment itself. Datacenter operators prefer liquid cooling in the datacenter because the operators often have water lines on the floor attached to the CRAC units, but not to the actual electronics. Quick disconnects are not needed as all liquid cooling interfaces are conduction plates.

Referring to FIG. 1B, the I/O rack 150 includes I/O cards 152. At the rear 180 of the I/O rack, I/O cables 182 facilitate communications between the I/O cards 152 and other parts of the data center infrastructure such as network devices and storage devices. I/O rack EO conversion devices 162 are located at the I/O rack front 170, or alternately at the I/O rack rear 180, near I/O rack optical ports 164. I/O rack optical cables 264 (shown in FIG. 2) connect the I/O rack optical ports 164 to the optical cable mezzanine 240 (shown in FIG. 2). Air cooling is used for the I/O rack 150 to cool the I/O hardware, with cool air in 174 provided to the cold aisle at front 170 of the I/O rack 150 and hot air 176 exhausted at the rear 180 of the I/O rack 150.

FIG. 2 is a top view of the exemplary liquid-cooled data center room 100 and exemplary air-cooled data center room 200. The liquid-cooled room 100 is connected to the air-cooled room 200 using compute rack optical cables 214, the optical cable mezzanine 240, and I/O rack optical cables 264. The compute rack optical cables 214 connect the compute rack optical ports 114 (shown in FIG. 1A) at the compute rack front 130 to the optical cable mezzanine 240. Since liquid cooling is used exclusively in the room containing compute racks 110, access aisles 210 can be maintained at unregulated room temperature, which permits this section of the data center to be economized for cooling infrastructure. On the other hand, traditional air cooling is used for the I/O rack 150, with cold aisles 270 at the I/O rack front 170 and hot aisles 280 at the I/O rack rear 180. Cold room air conditioning (CRAG) units 290 are used for air cooling of the I/O hardware, such as the I/O cards 152 (shown in FIG. 1B).

Separating the compute resources from the I/O resources achieves cost savings associated with power and cooling of server equipment in the datacenter. The datacenter infrastructure can be optimized around the type of equipment being deployed in these different sections of the datacenter. For example, the CPU and memory may be placed in a datacenter room that requires little air movement since the liquid cooling plumbing to the room can remove all of the heat involved in these types of products. In an adjacent room, conventional heating, ventilation, and air conditioning device (HVAC) or CRAC air conditioning units may be utilized for the I/O hardware. The cost savings involved within the datacenter may be used to offset the extra cost involved in optically cabling between the compute and I/O resources.

The advantages of the system for separating compute and I/O resources in the datacenter to enable space and power savings are as follows. The I/O hardware are separated from the server's compute hardware, such as CPU and memory, opening the opportunity to design products separately from each other. If products can be designed separately from each other, different means of cooling can be used for each product. Liquid cooling can be used for the compute hardware, while air cooling can be used for the I/O hardware, without the need to co-join cooling methods into a single product. The system further facilitates more efficient setup of datacenter infrastructure in order to save cost of power and cooling to servers. Without the I/O hardware, the server uses less floor space in the datacenter, thus saving electricity, equipment, and facilities cost to datacenter operators.

When the system is conductively cooled using a central heat exchanger 140, the system provides liquid cooling at the rack-level without bringing liquid into the same enclosure as the compute hardware itself. Quick disconnects are not needed since all liquid cooling interfaces are conduction plates, i.e., cold plates 102. Adoption of liquid cooling into the compute rack 110 may be more favorable and may lead to quicker deployment and faster savings for datacenter customers.

Further, the remote I/O devices are connected to the server using a switched communications fabric, which is more generic by connecting many servers to many I/O devices. As a result, the datacenter operator has more freedom to separate the server from the I/O devices at longer distances, and to separate different equipment into different locales of the datacenter.

Figure 3:
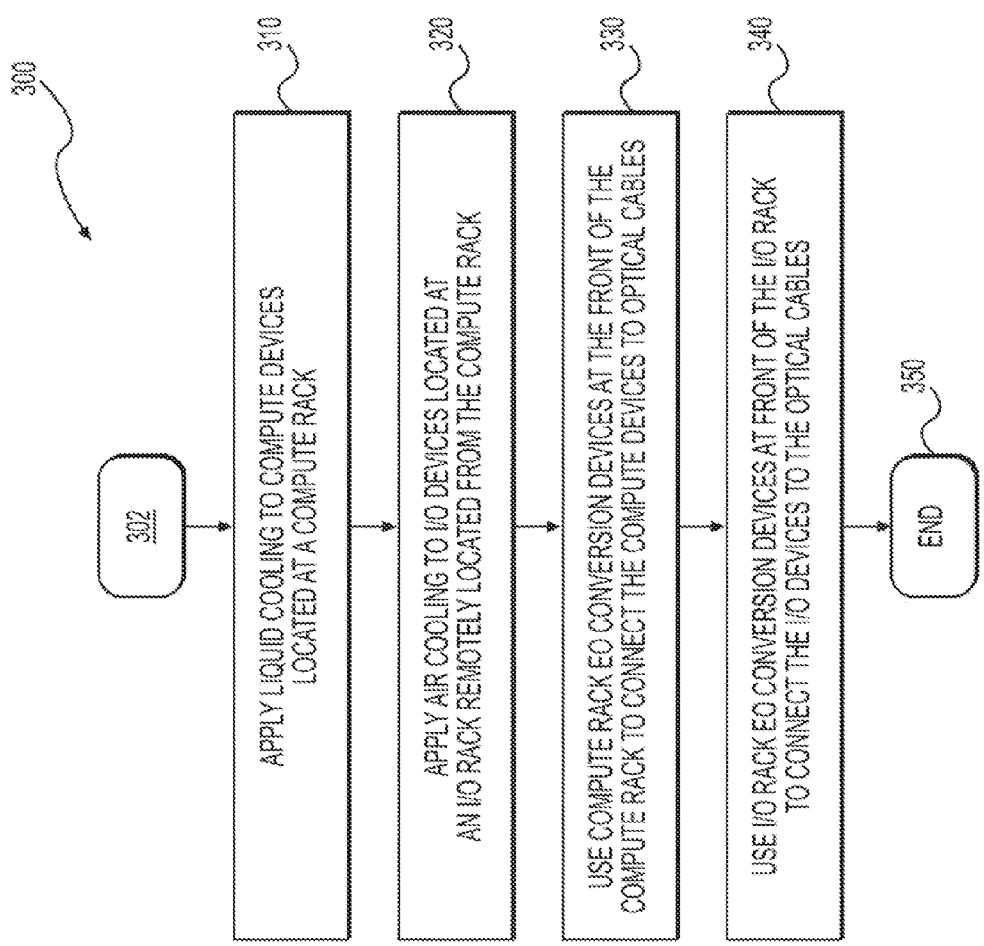
FIG. 3 is a flow chart illustrating an embodiment of a method for providing physically separated compute and I/O resources in the datacenter to enable space and power savings.

FIG. 3 is a flow chart illustrating an embodiment of a method 300 for providing physically separated compute and I/O resources in the datacenter to enable space and power savings. The method 300 starts 302 by applying liquid cooling exclusively to one or more compute devices located at a compute rack of a server infrastructure (block 310). The method 300 applies air cooling to one or more I/O devices located at an I/O rack, which is remotely located from the compute rack (block 320). The method 300 uses one or more compute rack EO conversion devices at the front of the compute rack to connect the one or more compute devices to optical cables (block 330). The method 300 further uses one or more I/O rack EO conversion devices at front of the I/O rack to connect the I/O devices to the optical cables (block 340). The method 300 ends at block 350.

Figure 4:
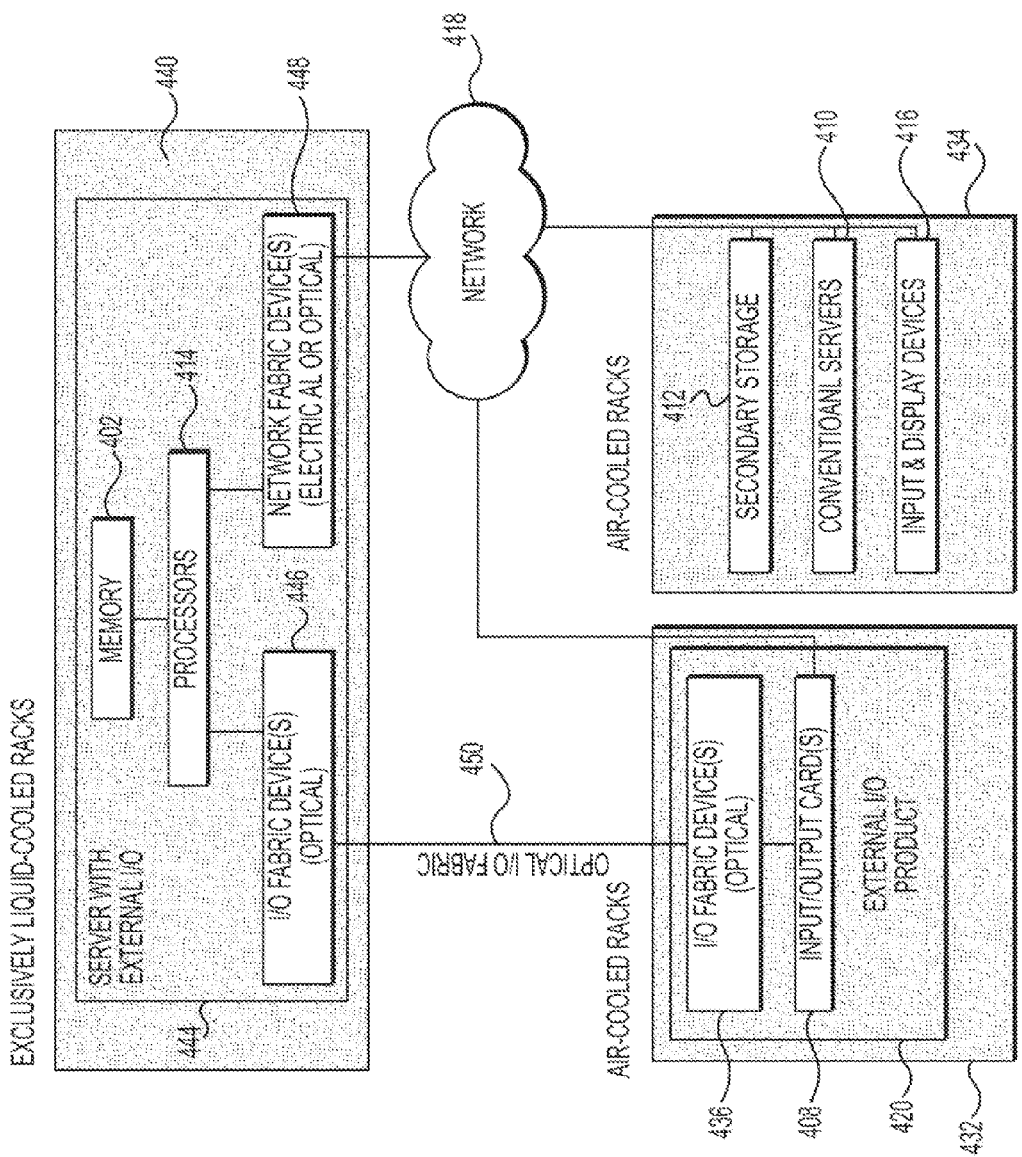
FIG. 4 illustrates exemplary hardware components of a computer that may be used in connection with the method for providing physically separated compute and I/O resources in the datacenter to enable space and power savings.

FIG. 4 illustrates exemplary hardware components of a computer that may be used in connection with the method for providing physically separated compute and input/output resources in the datacenter to enable space and power savings. The computer has exclusively liquid-cooled racks 440 and air-cooled racks 432, 434. The exclusively liquid-cooled racks 440 contain a server with external input/output 444, which typically includes a memory 402, a processors 414, I/O fabric devices 446, and network fabric devices 448. The air-cooled racks 432 contain external input/output products 420, which typically include input/output fabric devices 436 and input/output cards 408. The air-cooled racks 434 include a secondary storage device 412, conventional servers 410, and input & display devices 416. The secondary storage 412, the conventional servers 410, the input & display devices 416, the input/output cards 408, and the network fabric devices may be connected using a network 418 such as the Internet or other type of computer or telephone network. The input/output fabric devices 446 on the exclusively liquid-cooled racks 440 and the input/output fabric devices 436 on the air-cooled racks 432 may be connected using an optical input/output fabric 450.

The memory 402 may include random access memory (RAM) or similar types of memory. The secondary storage device 412 may include a hard disk drive, floppy disk drive, CD-ROM drive, flash memory, or other types of non-volatile data storage, and may correspond with various databases or other resources. The processor 414 may execute instructions to perform the method steps described herein. These instructions may be stored in the memory 402, the secondary storage 412, or received from the Internet or other network. The input & display devices 416 may include, respectively, any device for entering data into the computer 400, such as a keyboard, keypad, cursor-control device, touch-screen (possibly with a stylus), or microphone, and any type of device for presenting a visual image, such as, for example, a computer monitor, flat-screen display, or display panel. An output device connected to the input/output cards 408 may include any type of device for presenting data in hard copy format, such as a printer, and other types of output devices including speakers or any device for providing data in audio form. The computer can possibly include multiple input devices, output devices, and display devices.

Although the computer is depicted with various components, one skilled in the art will appreciate that the computer can contain additional or different components. In addition, although aspects of an implementation consistent with the method for providing physically separated compute and I/O resources in the datacenter to enable space and power savings are described as being stored in memory, one skilled in the art will appreciate that these aspects can also be stored on or read from other types of computer program products or computer-readable media, such as secondary storage devices, including hard, disks, floppy disks, or CD-ROM; or other forms of RAM or ROM. The computer-readable media may include instructions for controlling the computer to perform a particular method.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A system for providing physically separated compute and input/output (I/O) resources in a datacenter, the system comprising:
   a compute room, the compute room not having any cold or hot aisles;
   a compute rack of a server infrastructure for housing one or more compute resources in the compute room of the datacenter, wherein the compute rack uses liquid cooling for the one or more compute resources, the liquid cooling includes liquid lines to and from the compute rack;
   an I/O room remotely and separately located from the compute room, the I/O room including an I/O cold aisle having cool air and an I/O hot aisle having hot air;
   an I/O rack for housing one or more I/O resources in the I/O room of the datacenter, wherein the I/O rack uses air cooling for the one or more I/O resources, the air cooling includes the cool air provided from the I/O cold aisle to the I/O rack and the hot air exhausted from the I/O rack to the I/O hot aisle; and
   optical cables enabling communication between the one or more compute resources and the one or more I/O resources,
   wherein the one or more compute resources use more power than the one or more I/O resources.

2. The system of claim 1, wherein the compute rack includes one or more compute rack electrical to optical (EO) conversion devices at a front of the compute rack to connect to the optical cables.

3. The system of claim 1, wherein the computer rack includes one or more heat pipes conducting heat from the one or more compute resources to a heat exchanger including one or more cold plates, wherein the one or more cold plates are located at a rear of the compute rack.

4. The system of claim 3, wherein the one or more cold plates are separable, and wherein the liquid cooling occurs at the rear of the compute rack.

5. The system of claim 1, wherein the I/O rack includes one or more I/O rack electrical to optical (EO) conversion devices at a front of the I/O rack to connect to the optical cables.

6. The system of claim 1, wherein the air cooling at the I/O rack occurs with the cool air in at a front of the I/O rack and the hot air out at a rear of the I/O rack.

7. The system of claim 1, further comprising an optical cable mezzanine for housing the optical cables.

8. The system of claim 1, wherein the one or more compute resources include a central processing unit (CPU) and a memory, and wherein the one or more compute resources are located at a front of the compute rack.

9. A method for providing physically separated compute and input/output (I/O) resources in a datacenter, the method comprising:
   applying liquid cooling to one or more compute devices located at a compute rack in a compute room of a server infrastructure, the compute room not having any cold or hot aisles, and wherein the liquid cooling includes liquid lines to and from the compute rack; and
   applying air cooling to one or more I/O devices located at an I/O rack in an I/O room of the server infrastructure, wherein the I/O room is remotely and separately located from the compute room and includes an I/O cold aisle having cool air and an I/O hot aisle having hot air, and the air cooling includes the cold air provided from the I/O cold aisle to the I/O rack and the hot air exhausted from the I/O rack into the I/O hot aisle,
   wherein the one or more compute devices communicate with the one or more I/O devices using optical cables, and
   wherein the one or more compute devices use more power than the one or more I/O devices.

10. The method of claim 9, further comprising using one or more compute rack electrical to optical (EO) conversion devices at a front of the compute rack to connect the one or more compute devices to the optical cables.

11. The method of claim 9, wherein the applying liquid cooling step includes using one or more heat pipes to conduct heat from the one or more compute devices to a heat exchanger including one or more cold plates located at a rear of the compute rack.

12. The method of claim 9, further comprising using one or more I/O rack electrical to optical (EO) conversion devices at a front of the I/O rack to connect the I/O devices to the optical cables.

13. A server system with separate compute and input/output (I/O) resources in a datacenter, the server system comprising:
   a compute room, the compute room not having any cold or hot aisles;
   a compute rack for housing one or more compute devices in the compute room of the datacenter, wherein the compute rack includes a heat exchanger having one or more cold plates at a rear of the compute rack to provide liquid cooling for the one or more compute devices;
   an I/O room remotely and separately located from the compute room, the I/O room including an I/O cold aisle and an I/O hot aisle;
   an I/O rack for housing one or more I/O devices in the I/O room of the datacenter, wherein the I/O rack uses air cooling for the one or more I/O devices, the air cooling including cool air provided from the I/O cold aisle to the I/O rack and hot air exhausted from the I/O rack into the I/O hot aisle; and
   optical cables enabling communication between the one or more compute devices and the one or more I/O devices,
   wherein the one or more compute devices use more power than the one or more I/O devices.

14. The server system of claim 13, wherein:
the compute rack includes one or more compute rack electrical to optical (EO) conversion devices at a front of the compute rack to connect to the optical cables.

15. The server system of claim 13 wherein the computer rack includes one or more heat pipes conducting heat from the one or more compute devices to the heat exchanger.

* * * * *